US007751258B2

(12) United States Patent
Tsuchida

(10) Patent No.: US 7,751,258 B2
(45) Date of Patent: Jul. 6, 2010

(54) MAGNETIC RANDOM ACCESS MEMORY

(75) Inventor: Kenji Tsuchida, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 99 days.

(21) Appl. No.: 12/243,350

(22) Filed: Oct. 1, 2008

(65) Prior Publication Data
US 2009/0086532 A1 Apr. 2, 2009

(30) Foreign Application Priority Data
Oct. 2, 2007 (JP) .............................. 2007-258880

(51) Int. Cl.
G11C 5/14 (2006.01)
G11C 11/00 (2006.01)
G11C 11/14 (2006.01)
G11C 7/02 (2006.01)
(52) U.S. Cl. .................. 365/189.09; 365/158; 365/171; 365/209; 365/210.01
(58) Field of Classification Search ............ 365/189.09
See application file for complete search history.

(56) References Cited

U.S. PATENT DOCUMENTS

| 6,385,109 | B1 * | 5/2002 | Naji .................... 365/189.15 |
| 6,445,612 | B1 * | 9/2002 | Naji ........................ 365/158 |
| 6,496,436 | B2 | 12/2002 | Naji |
| 6,600,690 | B1 * | 7/2003 | Nahas et al. ............ 365/189.09 |
| 6,697,294 | B1 * | 2/2004 | Qi et al. ................. 365/210.15 |
| 6,791,890 | B2 * | 9/2004 | Ooishi ................... 365/189.15 |
| 6,982,908 | B2 * | 1/2006 | Cho ........................... 365/158 |
| 6,985,383 | B2 * | 1/2006 | Tang et al. ................... 365/171 |
| 7,116,598 | B2 * | 10/2006 | Shimizu et al. .......... 365/210.1 |
| 7,283,407 | B2 * | 10/2007 | Inoue et al. ............. 365/189.11 |
| 7,495,984 | B2 * | 2/2009 | Kim et al. ................ 365/210.1 |
| 7,511,992 | B2 * | 3/2009 | Ueda .......................... 365/158 |
| 2008/0205119 | A1 * | 8/2008 | Nagai et al. ................. 365/148 |

OTHER PUBLICATIONS

J.M. Slaughter, et al., "High Speed Toggle MRAM with MgO-Based Tunnel Junctions", IEEE International Electron Devices Meeting 2005 P35.7.1-3, 2005, 3 Pages.
J.Debrosse, et al., "A 16 Mb MRAM Featuring Bootstrapped Write Drivers", 2004 Symposium on VLSI Circuits, Digest of Technical Papers, 2004, pp. 454-457.

* cited by examiner

Primary Examiner—Son L Mai
(74) Attorney, Agent, or Firm—Oblon, Spivak, McClelland, Maier & Neustadt, L.L.P.

(57) ABSTRACT

A magnetic random access memory includes a memory cell having a first magnetoresistive effect element, a reference cell having a second magnetoresistive effect element set in a low-resistance state, a first bit line connected to the memory cell, and set at a first bias potential in a read operation, a second bit line connected to the reference cell, and set at a second bias potential in the read operation, and a reference voltage generator including a reference current generator having a third magnetoresistive effect element set in the high-resistance state, and a current-voltage converter having a fourth magnetoresistive effect element set in the low-resistance state, the reference current generator generating a first electric current by applying the first bias potential to the third magnetoresistive effect element, and the current-voltage converter generating the second bias potential by supplying a second electric current to the fourth magnetoresistive effect element.

20 Claims, 5 Drawing Sheets

MAGNETIC RANDOM ACCESS MEMORY

CROSS-REFERENCE TO RELATED APPLICATIONS

This application is based upon and claims the benefit of priority from prior Japanese Patent Application No. 2007-258880, filed Oct. 2, 2007, the entire contents of which are incorporated herein by reference.

BACKGROUND OF THE INVENTION

1. Field of the Invention

The present invention relates to a magnetic random access memory (MRAM) and, more particularly, to a bit line bias potential for a reference cell to be used when reading out stored information from a memory cell.

2. Description of the Related Art

The MRAM is a device that performs a memory operation by storing information "1" or "0" by using the magnetoresistive effect. The MRAM is regarded as a candidate for a universal memory device that is a highly integrated, highly reliable, low-power-consumption, nonvolatile device capable of a high-speed operation. Several manufacturers have begun developing MRAMs.

Many MRAMs using elements exhibiting the TMR (Tunneling Magneto Resistive) effect among other magnetoresistive effects have been reported. The TMR effect element has a stacked structure including an insulating film sandwiched between two metals as ferromagnetic layers. Generally, an MTJ (Magnetic Tunnel Junction) element using the change in magnetic resistance caused by the spin polarization tunnel effect is used as the TMR effect element.

More specifically, the MTJ element has the following resistance value. First, when the spin directions in the upper and lower ferromagnetic layers are parallel, the tunnel probability between the two magnetic layers sandwiching the tunnel insulating film is maximum, so the resistance value is minimum. On the other hand, when the spin directions in the upper and lower ferromagnetic layers are antiparallel, the tunnel probability is minimum, so the resistance value is maximum. To achieve these two spin states, the magnetization direction in one of the two magnetic films is normally fixed and set to be unaffected by external magnetization. This layer is generally called a pinned layer (fixed layer). The magnetization direction in the other magnetic film can be programmed to be parallel or antiparallel to that in the pinned layer in accordance with the direction of an applied magnetic field. This layer is generally called a free layer (recording layer), and has a function of storing information. The resistance change ratio (MR ratio) of the MTJ element is presently higher than 50%, and this high resistance change ratio directly ensures a large read margin. Accordingly, the TMR effect element is currently most frequently used in the development of the MRAM.

Data is read out from the MRAM using the MTJ element as follows. That is, a voltage is applied between the two magnetic layers of an MTJ element corresponding to a selected bit line, and the resistance value is read from an electric current flowing through this MTJ element. Alternatively, a constant current is supplied to a selected MTJ element, and a voltage generated between the two magnetic layers by this electric current is read out.

On the other hand, data is written in the MRAM using the MTJ element as follows. To reverse the magnetization direction in the free layer of the MTJ element, electric currents having a value equal to or larger than a predetermined value are supplied to a bit line and word line perpendicularly crossing a memory cell. The magnetization direction in the free layer is programmed by the magnitude of a synthetic magnetic field generated by the electric currents.

Non-patent reference 1 or the like is reported as an example of the MRAM using the MTJ element. A read circuit disclosed in non-patent reference 1 uses a reference cell having a pair of MTJ elements set in a low-resistance state and high-resistance state, in order to generate a reference signal to be input to a sense amplifier. A constant voltage is applied to these two MTJ elements, and electric currents flowing through the MTJ elements are added by a current mirror circuit and divided by 2, thereby generating a desired signal current.

By contrast, patent references 1 and 2 have proposed a method in which an MTJ element in the low-resistance state is used as a reference cell, a bit line clamp voltage for this reference cell is read out, and a potential different from this bit line clamp voltage is applied to a bit line clamp voltage for a memory cell, thereby generating a desired signal current. Since the method can reduce the number of reference cells in an array by half, the effect of reducing the chip size can be expected. Therefore, the method is optimum for high integration.

Unfortunately, the read methods disclosed in patent references 1 and 2 have the following problems.

As shown in FIG. 1 of patent references 1 and 2, an operational amplifier 35 and transistor 32 apply a potential VBIAS1 to a read cell 17 in a read operation. On the other hand, an operational amplifier 45 and transistor 42 apply VBIASREF different from that of the read cell 17 to a reference cell 27. A reference voltage generator shown in FIG. 3 of patent references 1 and 2 generates VBIASREF. In FIG. 3 of patent references 1 and 2, an MTJ element in a memory cell 60 is set in a low-resistance state Rmin, an MTJ element in a memory cell 62 is set in a high-resistance state Rmax, and VBIAS/2 that is ½ the bias potential of the read cell is applied to the positive input terminal of an operational amplifier 56, thereby generating VBIASREF given by $$VBIASREF = (VBIAS/2) \times (1 + Rmin/Rmax) \quad (1)$$

When the potential VBIASREF given by equation (1) above is applied to the operational amplifier 45 shown in FIG. 1 of patent references 1 and 2, an electric current IREF flowing through the reference cell 27 set in the low-resistance state is given by $$IREF = (VBIAS/2) \times (1/Rmin + 1/Rmax) \quad (2)$$

Assuming a read cell to which VBIAS is applied, the electric current IREF is ½ a signal current flowing through cells in the low-resistance state Rmin and high-resistance state Rmax, and hence is desirable as a reference signal. Accordingly, a signal voltage corresponding to read cell information is read out as VO and VOREF as the output potentials of a read-system circuit shown in FIG. 1 of patent references 1 and 2.

As indicated by equation (1), the potential generated by the reference potential generator shown in FIG. 3 of patent references 1 and 2 is expressed by only VBIAS/2 as the input potential to the operational amplifier 56 and the resistance values Rmin and Rmax of the MTJ elements having two different resistance values. The absolute resistance value of the MTJ element generally depends on bias. Qualitatively, the resistance value decreases as the voltage applied across the two terminals of the MTJ element increases.

When the bias dependence of the MTJ element as described above is taken into consideration, since the potential VBIAS/2 is applied to the MTJ element of the memory cell 62 to be set in the high-resistance state Rmax, the resistance is actually Rmax−ΔRmax, i.e., decreases. In addition, since a potential equal to or lower than VBIAS/2 is always applied to the MTJ element of the memory cell 60 to be set in the low-resistance state Rmin, the resistance is Rmin−ΔRmin, i.e., decreases. In this case, the potential VBIASREF produces an error at a predetermined value from a desired voltage. This means the fluctuation of the reference cell signal, and deteriorates the read margin.

[Non-patent reference 1] 2004 Symposium on VLSI Circuits Digest of Technical Paper, pp. 454-457, "16 Mb MRAM Featuring Bootstrap Write Driver"

[Non-patent reference 2] IEEE International Device Meeting 2005, "High Speed Toggle MRAM with MgO-Based Tunnel Junctions"

[Patent reference 1] U.S. Pat. No. 6,385,109

[Patent reference 2] U.S. Pat. No. 6,496,436

BRIEF SUMMARY OF THE INVENTION

A magnetic random access memory according to an aspect of the present invention comprising a memory cell having a first magnetoresistive effect element which changes to a high-resistance state and a low-resistance state; a reference cell having a second magnetoresistive effect element set in the low-resistance state; a first bit line connected to the memory cell, and set at a first bias potential in a read operation; a second bit line connected to the reference cell, and set at a second bias potential different from the first bias potential in the read operation; and a reference voltage generator including a reference current generator having a third magnetoresistive effect element set in the high-resistance state, and a current-voltage converter having a fourth magnetoresistive effect element set in the low-resistance state, the reference current generator generating a first electric current by applying the first bias potential to the third magnetoresistive effect element, and the current-voltage converter generating the second bias potential by supplying a second electric current different from the first electric current to the fourth magnetoresistive effect element.

DETAILED DESCRIPTION OF THE INVENTION

The present inventors made the following examination in order to more practically check the conventional problems described above.

An $Al_2O_3$ film has been conventionally used as an insulating film in an MTJ element (magnetoresistive effect element). However, the application of an MgO film by which a high resistance change ratio is obtained is recently reported (e.g., non-patent reference 2).

Figure 1:
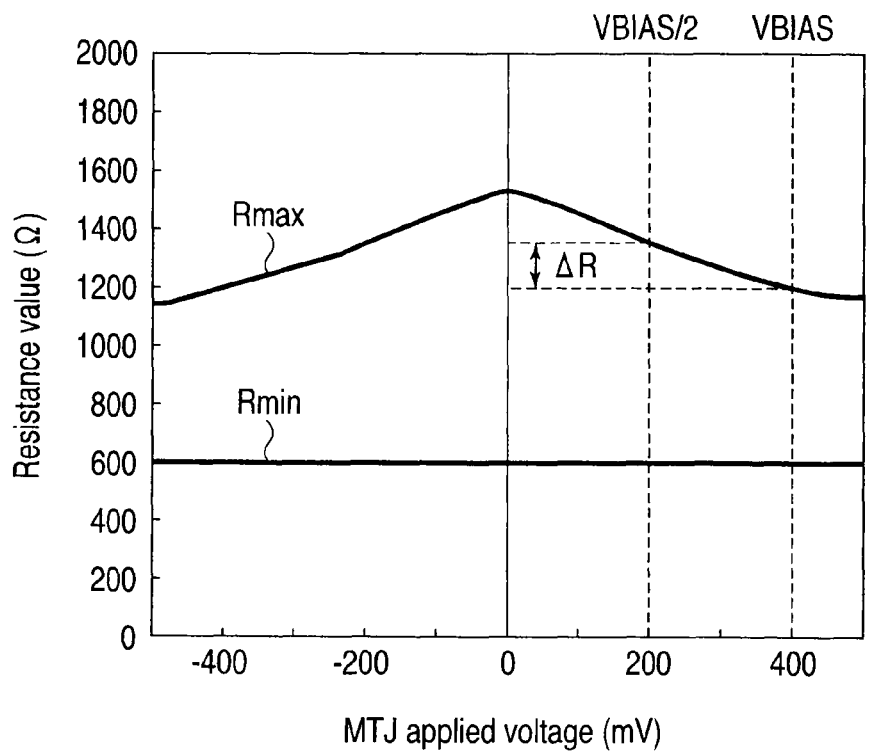
FIG. 1 is a graph showing examples of the measured bias dependences of the resistance values of an MTJ element using an MgO film.

FIG. 1 shows examples of the measured bias dependences of the resistance values of an MTJ element using the MgO film. Referring to FIG. 1, the abscissa indicates the voltage applied to the MTJ element, and the ordinate indicates a measured resistance value Rmax (Rap) in a high-resistance state and a measured resistance value Rmin (Rp) in a low-resistance state.

As shown in FIG. 1, the measured resistance value Rmin of the MTJ element in the low-resistance state hardly fluctuates even when the applied voltage changes, but the measured resistance value Rmax of the MTJ element in the high-resistance state fluctuates when the applied voltage changes. That is, the most significant feature is that the bias dependence in the low-resistance state is relatively smaller than that in the high-resistance state. A general explanation is that in the low-resistance state, i.e., when the magnetization directions in two magnetic layers of the MTJ element are parallel, a special band conduction channel (Δ1 band) is formed in MgO by lattice coupling, and this band conduction channel decreases the bias dependence of the attenuation of a wave function in a barrier film.

Figure 3:
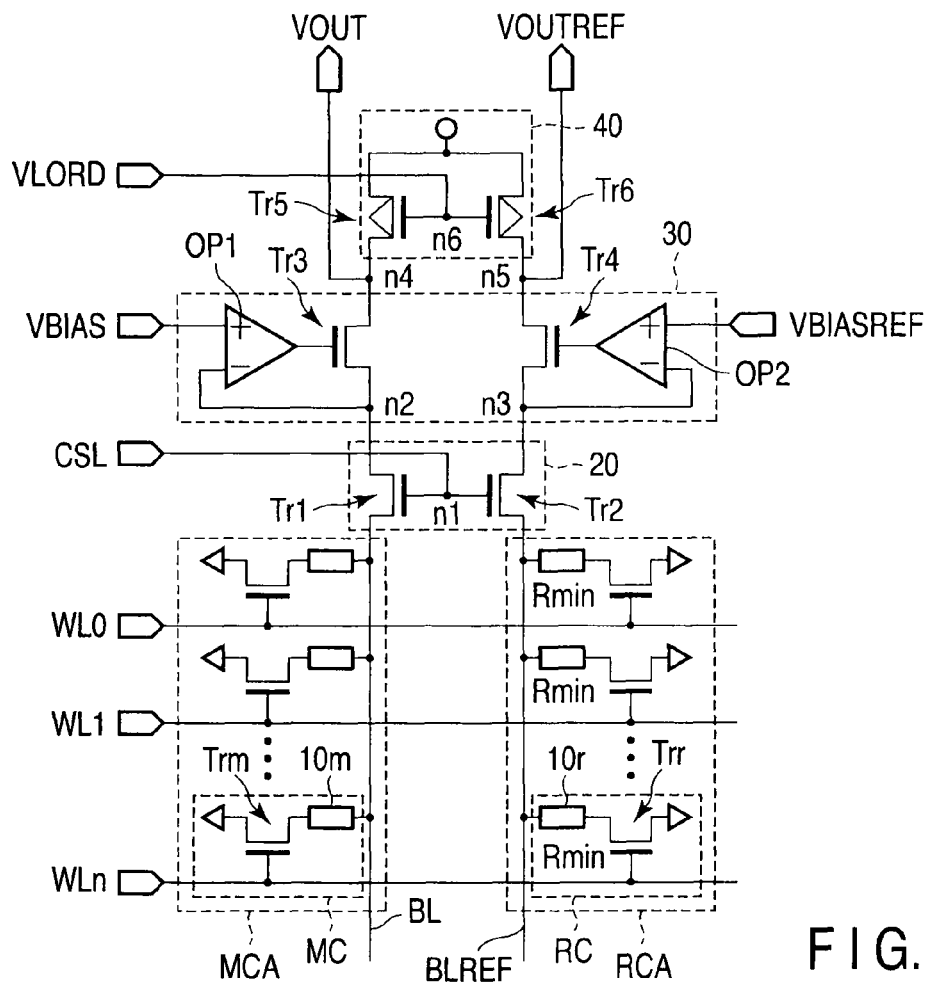
FIG. 3 is a circuit diagram showing examples of circuits of a read system of an MRAM to which a reference voltage generator for a reference cell according to the first embodiment of the present invention is applied.

Assuming the characteristics of the MTJ element using the MgO film as shown in FIG. 1, the reference voltage generator for a reference cell disclosed in FIG. 3 of patent references 1 and 2 can generate only a voltage lower than the desired voltage as the generated voltage VBIASREF. This is so because the voltage VBIAS/2 is applied to the MTJ element in the memory cell 62 in the high-resistance state, so the resistance value slightly rises from that in the state in which VBIAS is applied (FIG. 1). Accordingly, only an electric current smaller than the desired electric current flows through the MTJ element in the memory cell 60 set in the low-resistance state. On the other hand, the bias dependence of the resistance of the MTJ element in the memory cell 60 set in the low-resistance state is extremely small (FIG. 1). As a consequence, the potential VBIASREF becomes lower than the desired potential.

Figure 2:
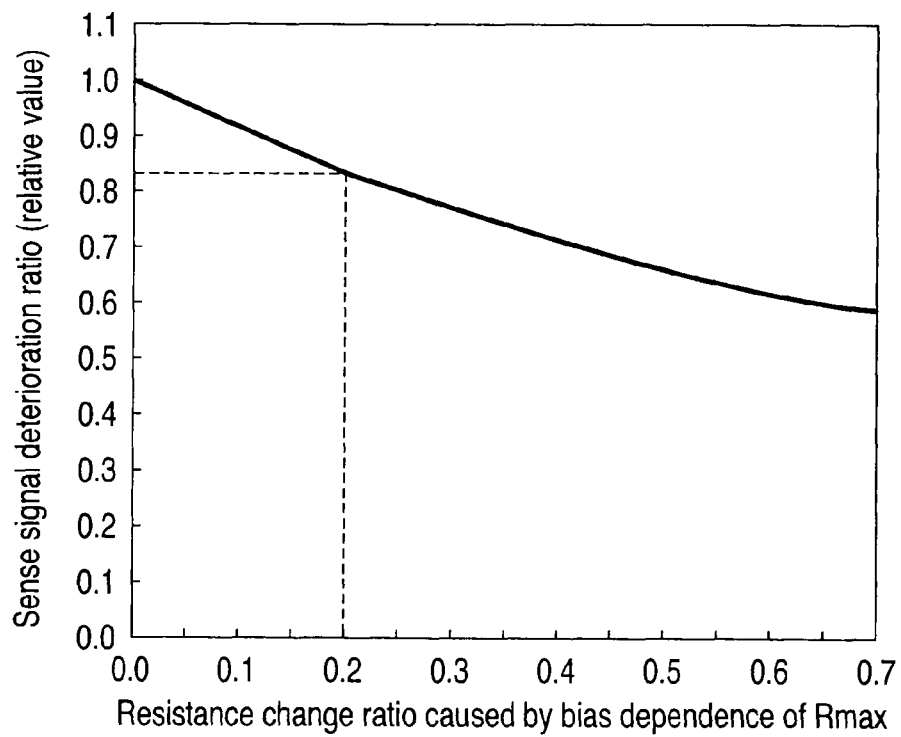
FIG. 2 is a graph showing the results of the calculations of the resistance change ratio obtained by the bias dependence of an MTJ element in a high-resistance state and the deterioration ratio of a sense signal.

FIG. 2 shows the results of the calculations of the resistance change ratio obtained by the bias dependence of the MTJ element in the high-resistance state and the deterioration ratio of a sense signal.

As shown in FIG. 2, the sense deterioration ratio increases as the resistance change ratio obtained by the bias dependence of the MTJ element in the high-resistance state increases. For example, when the resistance change ratio obtained by the bias dependence is 20%, the sense signal deteriorates by 17%. This means a large decrease in read margin.

Accordingly, the present invention improves the method of generating a reference signal to be input to a sense amplifier circuit, and proposes the configuration of a bit line clamp circuit for a reference cell, thereby suppressing the potential fluctuation caused by the resistance fluctuation resulting from the bias dependence of the MTJ element, and reducing the deterioration of the read margin.

Embodiments of the present invention as described above will be explained below with reference to the accompanying drawing. In the following explanation, the same reference numerals denote the same parts throughout the drawing.

[1] First Embodiment

In the first embodiment, a reference voltage generator for generating a bit line bias potential for a reference cell has an MTJ element set in the high-resistance state and an MTJ element set in the low-resistance state, and only a voltage corresponding to a bit line bias voltage for a read cell is applied to the MTJ element set in the high-resistance state.

[1-1] Circuits of Read System

FIG. 3 shows examples of circuits of a read system of an MRAM to which the reference voltage generator for a reference cell according to the first embodiment of the present invention is applied. Note that in FIG. 3, various controllers arranged in the periphery of a memory cell array MCA are omitted.

As shown in FIG. 3, the circuits of the read system are the memory cell array MCA, a reference cell array RCA, a column gate circuit 20, a bit line bias circuit 30, and a current conveyor 40.

In the memory cell array MCA, a plurality of memory cells MC for storing information are arranged in a matrix. Each memory cell MC has an MTJ element 10m and MOS transistor Trm for selective read. The MTJ element 10m has one terminal connected to one end of the current path of the MOS transistor Trm, and the other terminal connected to a bit line BL. The bit line BL is shared by a plurality of MTJ elements 10m. The other end of the current path of the MOS transistor Trm is connected to a ground terminal or power supply terminal. The gate of the MOS transistor Trm is connected to a word line WLn (n=0, 1, . . . ) Different word lines WLn are connected to different memory cells MC.

The reference cell array RCA comprises a plurality of reference cells RC. Each reference cell RC has an MTJ element 10r and MOS transistor Trr for selective read. All the MTJ elements 10r of the reference cells RC are set in the low-resistance state. The MTJ element 1r has one terminal connected to one end of the current path of the MOS transistor Trr, and the other terminal connected to a reference bit line BLREF. The reference bit line BLREF is shared by a plurality of MTJ elements 10r. The other end of the current path of the MOS transistor Trr is connected to the ground terminal or power supply terminal. The gate of the MOS transistor Trr is connected to the word line WLn (n=0, 1, . . . ) Different word lines WLn are connected to different reference cells RC, and are shared by the corresponding different memory cells MC.

The column gate circuit 20 comprises MOS transistors Tr1 and Tr2. One end of the current path of the MOS transistor Tr1 is connected to the bit line BL, and one end of the current path of the MOS transistor Tr2 is connected to the reference bit line BLREF. The gates of the MOS transistors Tr1 and Tr2 are connected to each other, and a column selection signal line CSL is connected to a node n1 as the connection point.

The bit line bias circuit 30 comprises MOS transistors Tr3 and Tr4 and operational amplifiers OP1 and OP2. One end of the current path of the MOS transistor Tr3 is connected to the other end of the current path of the MOS transistor Tr1, and a connection node n2 between the MOS transistors Tr3 and Tr1 is connected to the inverting input terminal (−) of the operational amplifier OP1. One end of the current path of the MOS transistor Tr4 is connected to the other end of the current path of the MOS transistor Tr2, and a connection node n3 between the MOS transistors Tr4 and Tr2 is connected to the inverting input terminal (−) of the operational amplifier OP2. The output terminal of the operational amplifier OP1 is connected to the gate of the MOS transistor Tr3. The output terminal of the operational amplifier OP2 is connected to the gate of the MOS transistor Tr4. A bias potential VBIAS is applied to the positive input terminal (+) of the operational amplifier OP1. A bias potential VBIASREF is applied to the positive input terminal (+) of the operational amplifier OP2. The bias potential VBIASREF for the reference cell RC differs from the bias potential VBIAS for the memory cell MC. In this embodiment, the bias potential VBIASREF is lower than the bias potential VBIAS.

The current conveyor 40 comprises PMOS transistors Tr5 and Tr6. One end of the current path of the PMOS transistor Tr5 is connected to the other end of the current path of the MOS transistor Tr3, and a connection node n4 between the MOS transistors Tr5 and Tr3 outputs a voltage signal VOUT. One end of the current path of the PMOS transistor Tr6 is connected to the other end of the current path of the MOS transistor Tr4, and a connection node n5 between the MOS transistors Tr6 and Tr4 outputs a voltage signal VOUTREF. The gates of the PMOS transistors Tr5 and Tr6 are connected to each other, and an intermediate voltage VLOAD is applied to a node n6 as the connection point.

The MTJ elements 10m and 10r used in this embodiment each have a fixed layer, a recording layer, and a nonmagnetic layer sandwiched between the fixed layer and recording layer. The nonmagnetic layer is made of, e.g., an MgO film. The magnetization directions in the fixed layer and recording layer can be perpendicular to the film surfaces to form a perpendicular magnetization type element, or parallel to the film surfaces to form an in-plane magnetization type element. Each of the fixed layer and recording layer may comprise a single ferromagnetic layer or stacked ferromagnetic layers, and may also have a structure in which two ferromagnetic layers sandwich a nonmagnetic layer.

[1-2] Reference Voltage Generator for Reference Cell

Figure 4:
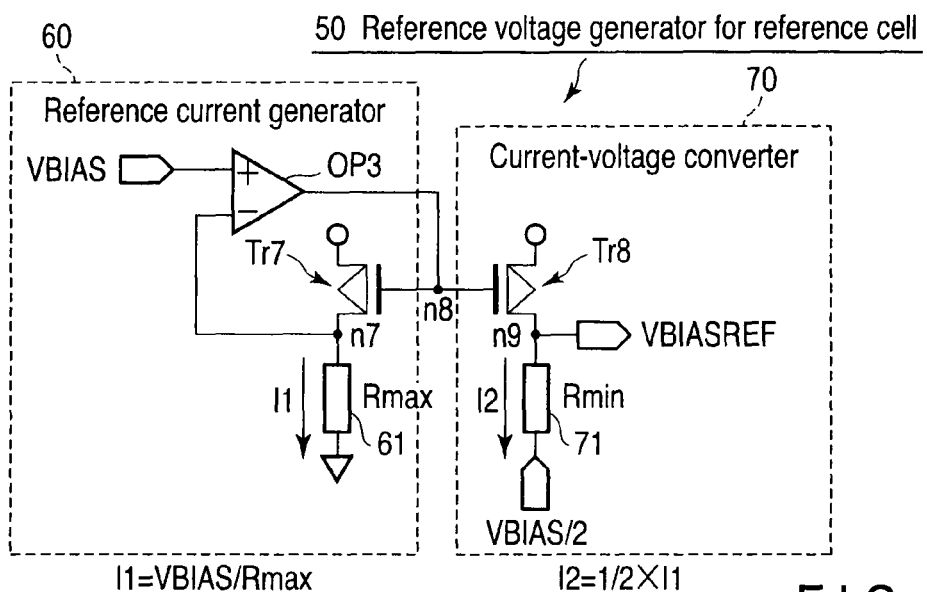
FIG. 4 is a circuit diagram showing the reference voltage generator for a reference cell of a magnetic random access memory according to the first embodiment of the present invention.

FIG. 4 is a circuit diagram of the reference voltage generator for a reference cell of the magnetic random access memory according to the first embodiment of the present invention. The reference voltage generator for a reference cell according to the first embodiment will be explained below.

As shown in FIG. 4, a reference voltage generator 50 for a reference cell according to the first embodiment comprises two circuit stages. The first circuit stage is a reference current generator 60 using an MTJ element 61 set in the high-resistance state. The second circuit stage is a current-voltage converter 70 that receives a reference current I1 generated by the first circuit stage, and uses an MTJ element 71 set in the low-resistance state. The first and second circuit stages are connected by a current mirror connection. A practical configuration is as follows.

The reference current generator 60 comprises the MTJ element 61 set in the high-resistance state, a PMOS transistor Tr7, and an operational amplifier OP3. The MTJ element 61 has one terminal connected to one end of the current path of the PMOS transistor Tr7, and the other terminal connected to a ground terminal. A node n7 as the connection point between the MTJ element 61 and PMOS transistor Tr7 is connected to the inverting input terminal (−) of the operational amplifier OP3. The output terminal of the operational amplifier OP3 is connected to the gate of the PMOS transistor Tr7. A bias potential VBIAS that is the same as the bias potential VBIAS for the memory cell MC is applied to the positive input terminal (+) of the operational amplifier OP3.

The current-voltage converter 70 comprises the MTJ element 71 set in the low-resistance state, and a PMOS transistor Tr8. One terminal of the MTJ element 71 is connected to one end of the current path of the PMOS transistor Tr8. A bias potential VBIAS/2 that is ½ the bias potential VBIAS for the memory cell MC is applied to the other terminal of the MTJ element 71. The gate of the PMOS transistor Tr8 is connected to a connection node n8 between the output terminal of the operational amplifier OP3 and the gate of the PMOS transistor Tr7. The bias potential VBIASREF for the reference cell RC is generated in a node n9 as the connection point between the MTJ element 71 and PMOS transistor Tr8.

The relationship between the PMOS transistor Tr7 of the reference current generator 60 and the PMOS transistor Tr8 of the current-voltage converter 70 is as follows. First, the circuit dimensions of the PMOS transistor Tr7 are determined such that it operates in the saturation region. Also, the PMOS transistor Tr7 is connected to the PMOS transistor Tr8 by a current mirror connection. The current mirror ratio of the PMOS transistor Tr7 to the PMOS transistor Tr8 is 2:1. More specifically, the ratio of the gate width of the PMOS transistor Tr7 to that of the PMOS transistor Tr8 is 2:1. Accordingly, an electric current I2 that is ½ the reference current I1 flows through the current-voltage converter 70 as the second circuit stage.

[1-3] Bias Potential VBIASREF for Reference Cell

The generation of the bias potential VBIASREF for a reference cell in this embodiment will be explained below with reference to FIG. 4.

First, the reference current I1 flows through the reference current generator 60 as the first circuit stage. The reference current I1 is determined by a resistance value Rmax of the MTJ element 61 in the high-resistance state and the input voltage VBIAS to the operational amplifier OP3. Therefore, the value of the reference current I1 is represented by $$I1 = VBIAS/Rmax \quad (3)$$

The PMOS transistor Tr7 in the first circuit stage operates in the saturation region, and is connected to the PMOS transistor Tr8 in the second circuit stage by a current mirror connection at a mirror ratio of 2:1. Hence, the electric current I2 that is ½ the reference current I1 flows through the second circuit stage. Accordingly, the value of the electric current I2 is given by $$I2 = I1/2 = VBIAS/2Rmax \quad (4)$$

The electric current I2 flows through the MTJ element 71 in the low-resistance state, and the potential VBIAS/2 is applied to one terminal of the MTJ element 71. Therefore, the bias potential VBIASREF for a reference cell generated in the node n9 is represented by $$VBIASREF = (VBIAS/2) + (I2 \times Rmin)$$

$$VBIASREF = (VBIAS/2) \times (1 + Rmin/Rmax) \quad (5)$$

In this embodiment as described above, VBIAS alone is the voltage to be applied to the MTJ element 61 in the high-resistance state, and no VBIAS/2 is applied to the MTJ element 61 in the high-resistance state. Accordingly, the resistance fluctuation caused by the bias dependence as shown in FIG. 1 has no influence on the MTJ element 61 in the high-resistance state. On the other hand, a voltage equal to or lower than VBIAS/2 is applied to the MTJ element 71 in the low-resistance state. As shown in FIG. 1, however, the bias dependence of the MTJ element 71 in the low-resistance state is extremely small. Compared to the prior art, therefore, the bias potential VBIASREF for a reference cell in this embodiment is an ideal potential that does not deteriorate the sense margin.

Note that, as is apparent from equation (5), the reference voltage generator 50 of this embodiment can, of course, also generate the same bias potential VBIASREF as that of the prior art indicated by equation (1).

[1-4] Read Operation

The read operation of this embodiment will be explained below with reference to FIGS. 3 and 4.

First, the word line WLn corresponding to the address of the memory cell MC as an object of read (to be referred to as a read object cell hereinafter) is activated. Consequently, the resistance value of the read object cell is read out to the bit line BL, and the resistance value of the reference cell RC corresponding to the read object cell is read out to the reference bit line BLREF.

Also, the column selection signal line CSL activates a specific column gate circuit 20 in accordance with the address of the read object cell. As a consequence, the bit line BL and reference bit line BLREF are connected to the bit line bias circuit 30. The bit line bias circuit 30 sets the potential of the bit line BL of the read object cell at VBIAS, and the potential of the reference bit line BLREF at VBIASREF. More specifically, the bias potential VBIASREF generated by the reference voltage generator 50 shown in FIG. 4 is input to the positive input terminal (+) of the operational amplifier OP2.

Since all the MTJ elements 10r of the reference cells RC are set in the low-resistance state Rmin, an electric current IREF flowing through the reference cell RC is represented by $$IREF = VBIASREF/Rmin$$

$$IREF = (VBIAS/2) \times (1/Rmin + 1/Rmax) \quad (6)$$

Since equation (6) above is completely the same as equation (2) of the prior art, normal read is presumably performed.

Then, the reference cell current IREF given by equation (6) and the cell current of the read object cell are converted into voltages by the PMOS transistors Tr5 and Tr6 to the gates of which the intermediate voltage VLOAD sufficient to allow these transistors to operate in the saturation region is input. The voltage signals VOUT and VOUTREF obtained by the conversion are amplified by, e.g., a general differential amplifier, and read outside the chip.

A sense amplifier compares the voltage signal VOUT of the read object cell with the voltage signal VOUTREF of the reference cell, and determines the resistance state of the MTJ element 10m of the read object cell. That is, if the voltage signal VOUT of the MTJ element 10m is lower than the voltage signal VOUTREF, it is determined that the data in the MTJ element 10m is the low-resistance state (e.g., data "0"). On the other hand, if the voltage signal VOUT of the MTJ element 10m is higher than the voltage signal VOUTREF, it is determined that the data in the MTJ element 10m is the high-resistance state (e.g., data "1").

[1-5] Write Operation

The write operation of this embodiment can be either current-induced magnetic field write or spin transfer torque magnetization reversal write.

Current-induced magnetic field write is performed as follows. First, the bit line BL and word line WLn corresponding to a write object cell are selected, and write currents are supplied to the bit line BL and word line WLn. The magnetization in the MTJ element 10m is reversed by applying the synthetic magnetic field of these write currents to the write object cell. In this way, the magnetization directions in the fixed layer and recording layer of the MTJ element 10m are set in the parallel state (low-resistance state) or the antiparallel state (high-resistance state).

Spin transfer torque magnetization reversal write is performed as follows. First, when writing data "0", an electric current I is supplied from the recording layer to the fixed layer of the MTJ element 10m. That is, electrons e are injected from the fixed layer side to the recording layer side. As a consequence, the magnetizations in the fixed layer and recording layer point in the same direction to take the parallel state. This low-resistance state is defined as data "0". On the other hand, when writing data "1", the electric current I is supplied from the fixed layer to the recording layer of the MTJ element 10m. That is, the electrons e are injected from the recording layer side to the fixed layer side. Consequently, the magnetizations in the fixed layer and recording layer point in opposite directions to take the antiparallel state. This high-resistance state is defined as data "1".

[1-6] Effects

In the first embodiment described above, the reference cell RC comprises the MTJ element 10r set in only the low-resistance state, and the desired reference current IREF is generated by applying the exclusive bias voltage VBIASREF to the reference cell RC. The bias voltage VBIASREF of the reference cell RC is generated by applying only the same voltage as the bit line bias voltage VBIAS of the read object cell across the two terminals of the MTJ element 61 set in the high-resistance state. Since the resistance fluctuation caused by the bias dependence of the MTJ element can be minimized, therefore, the potential fluctuation resulting from this resistance fluctuation can be suppressed. This makes it possible to reduce the deterioration of the read margin, and implement a highly reliable MRAM having a large read margin.

[2] Second Embodiment

The second embodiment is a modification of the configuration for generating the bias voltage VBIAS/2 in the current-voltage converter 70 of the first embodiment. Note that a repetitive explanation of the same features as those of the first embodiment will be omitted in this embodiment.

[2-1] Reference Voltage Generator for Reference Cell

Figure 5:
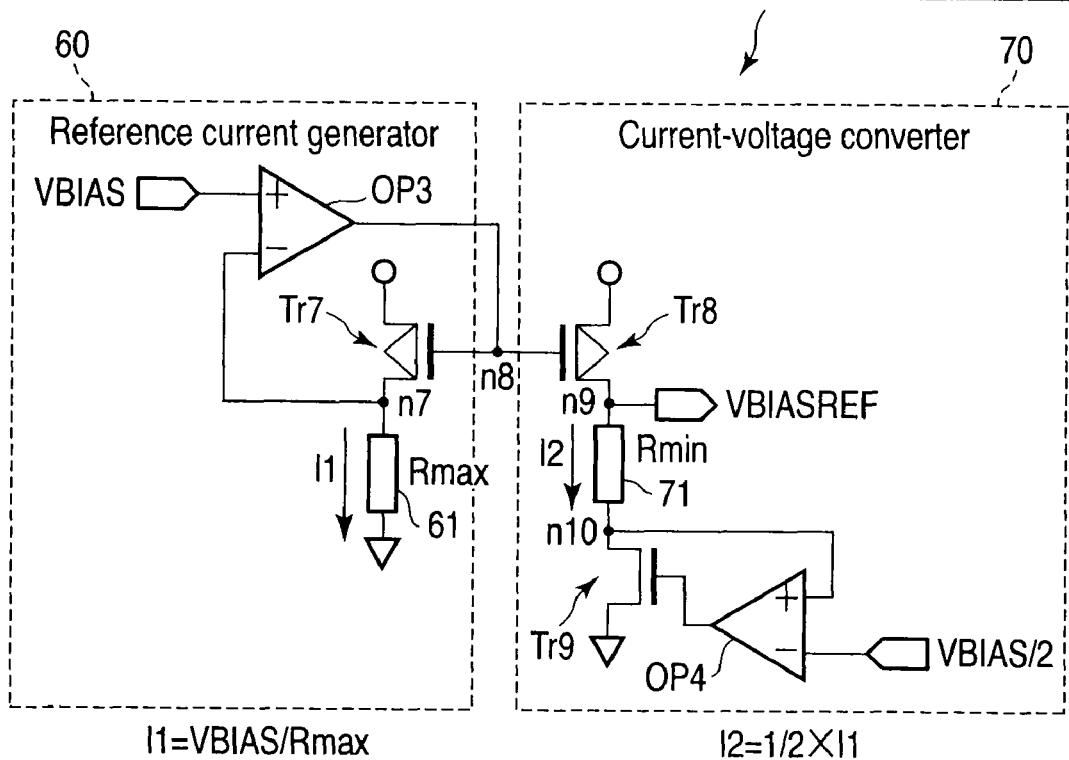
FIG. 5 is a circuit diagram showing a reference voltage generator for a reference cell of a magnetic random access memory according to the second embodiment of the present invention.

FIG. 5 is a circuit diagram of a reference voltage generator for a reference cell of a magnetic random access memory according to the second embodiment of the present invention. The reference voltage generator for a reference cell according to the second embodiment will be explained below.

As shown in FIG. 5, the second embodiment differs from the first embodiment in the connection between a bias potential VBIAS/2 and an MTJ element 71 in the low-resistance state.

More specifically, a current-voltage converter 70 of the second embodiment further comprises an NMOS transistor Tr9 and operational amplifier OP4. One terminal of the current path of the NMOS transistor Tr9 is connected to the MTJ element 71, and a connection node n10 between one end of the current path of the NMOS transistor Tr9 and the MTJ element 71 is connected to the positive input terminal (+) of the operational amplifier OP4. The output terminal of the operational amplifier OP4 is connected to the gate of the NMOS transistor Tr9. The potential VBIAS/2 that is ½ a bias potential VBIAS of a memory cell MC is applied to the inverting input terminal (−) of the operational amplifier OP4.

Note that a reference voltage generator 50 for a reference cell according to this embodiment is also applicable to the read-system circuits of the MRAM shown in FIG. 3 without any contradiction.

[2-2] Effects

The second embodiment described above can achieve the same effects as those of the first embodiment, and can also achieve the following effect.

Generally, the output impedance of a voltage circuit for generating the potential VBIAS/2 is set high in order to reduce the power consumption of an MRAM. In this case, if a steady-state current flows into the power supply of VBIAS/2, the potential is highly likely to fluctuate. This increases the fluctuation of a bias potential VBIASREF for a reference cell.

In the second embodiment, therefore, the potential VBIAS/2 is connected to the inverting input terminal (−) of the operational amplifier OP4 having a high input impedance, and the potential of the terminal of the MTJ element 71 is set at VBIAS/2. Accordingly, the bias potential VBIASREF having a desired value can be generated, and the generated potential is an extremely ideal potential because no potential except VBIAS is applied to an MTJ element 61 in the high-resistance state.

[3] Third Embodiment

In the third embodiment, a third stage circuit is added to the reference voltage generator 50 for a reference cell in each of the first and second embodiments. Note that a repetitive explanation of the same features as those of the first and second embodiments will be omitted in this embodiment.

[3-1] Reference Voltage Generators for Reference Cell

Figure 6:
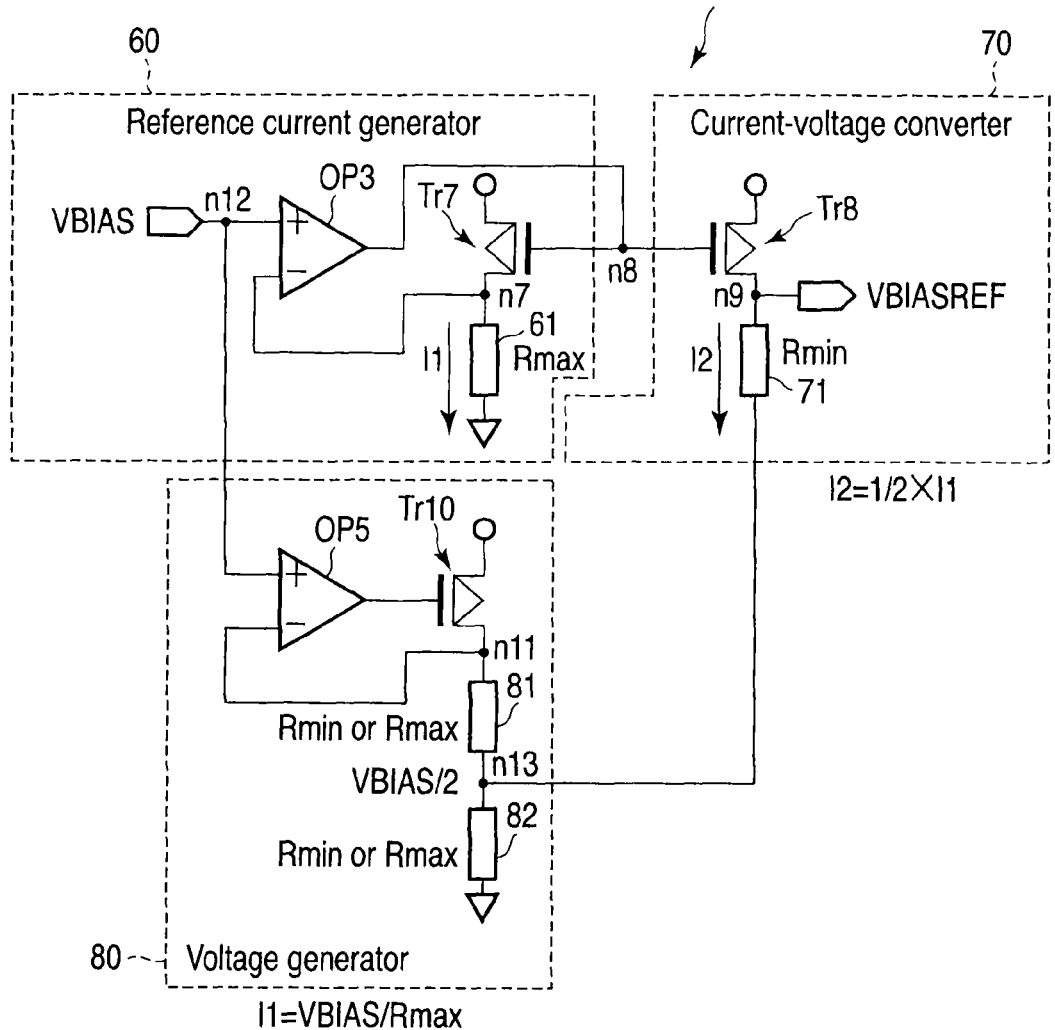
FIG. 6 is a circuit diagram showing a reference voltage generator for a reference cell of a magnetic random access memory according to the third embodiment of the present invention.
Figure 7:
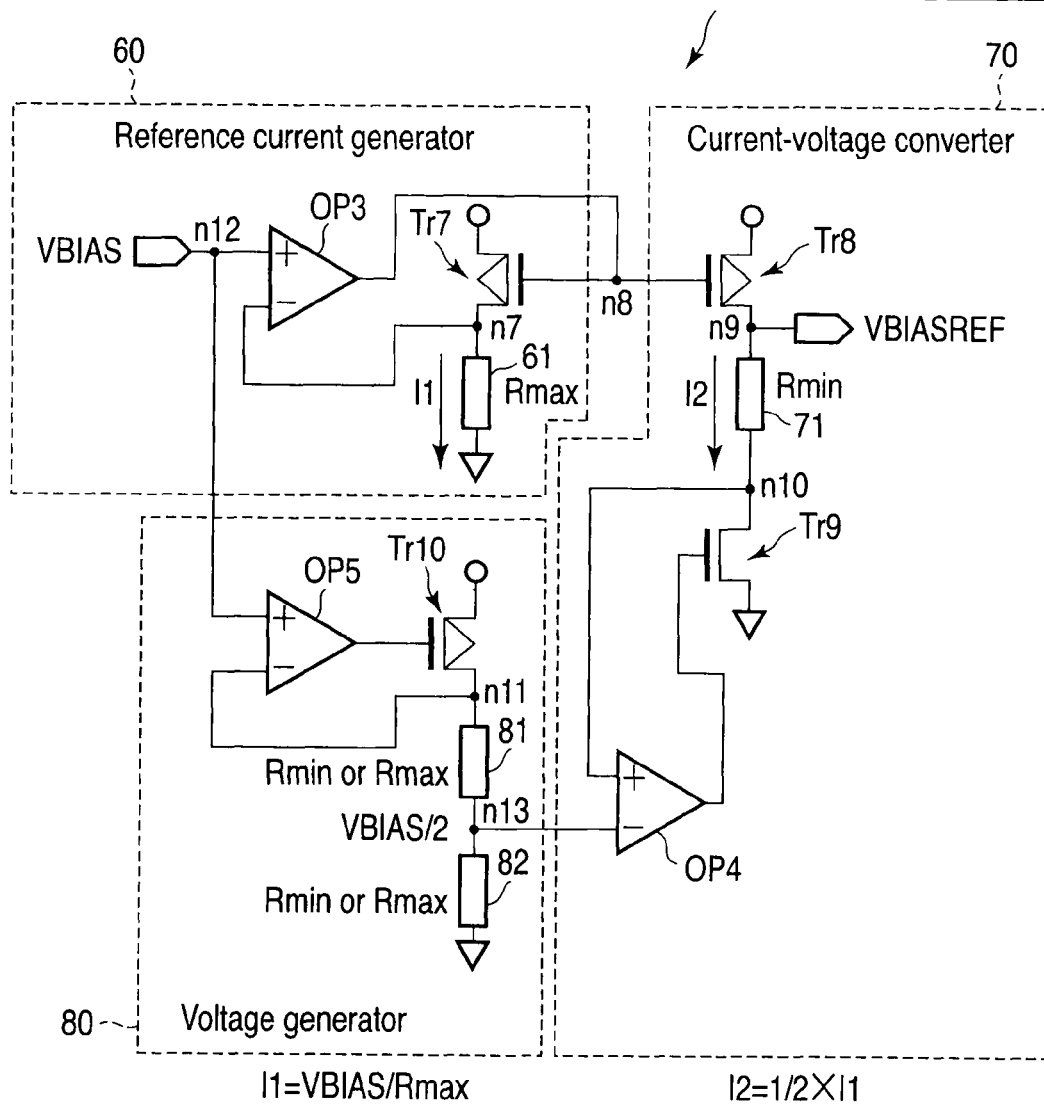
FIG. 7 is a circuit diagram showing another reference voltage generator for a reference cell of the magnetic random access memory according to the third embodiment of the present invention.

FIGS. 6 and 7 are circuit diagrams of reference voltage generators for a reference cell of a magnetic random access memory according to the third embodiment of the present invention. The reference voltage generators for a reference cell according to the third embodiment will be explained below.

As shown in FIGS. 6 and 7, the third embodiment differs from the first and second embodiments in that the third embodiment has a third stage circuit for generating a potential VBIAS/2 from VBIAS.

The third stage circuit is a voltage generator 80 for generating the bias potential VBIAS/2 to be applied to a current-voltage converter 70, on the basis of a bias potential VBIAS for a memory cell. The voltage generator 80 comprises MTJ elements 81 and 82, a PMOS transistor Tr10, and an operational amplifier OP5.

Although this embodiment uses the two MTJ elements 81 and 82, any even number of MTJ elements can be used. Note that both the MTJ elements 81 and 82 are set in the low- or high-resistance state, i.e., the same resistance state. The MTJ elements 81 and 82 are connected in series to form an element group. The potential VBIAS/2 that is ½ the bias potential VBIAS for a memory cell is generated in a middle point n13 as a connection point in this element group. Note that the middle point n13 of the element group is a connection point at which MTJ elements are divided into two against two if the number of the MTJ elements are four, or divided into three against three if the number of the MTJ elements are six.

One terminal of the element group is connected to one end of the current path of the PMOS transistor Tr10, and a connection node n11 between the element group and one end of the current path of the PMOS transistor Tr10 is connected to the inverting input terminal (−) of the operational amplifier OP5. The output terminal of the operational amplifier OP5 is connected to the gate of the PMOS transistor Tr10.

In the example shown in FIG. 6, the third stage circuit is added to the reference voltage generator 50 for a reference cell in the first embodiment. Therefore, the potential VBIAS/2 at the middle point n13 of the element group is directly connected to an MTJ element 71 in the low-resistance state of the current-voltage converter 70.

In the example shown in FIG. 7, the third stage circuit is added to the reference voltage generator 50 for a reference cell in the second embodiment. Accordingly, the potential VBIAS/2 at the middle point n13 of the element group is connected to the inverting input terminal (−) of the operational amplifier OP4 of the current-voltage converter 70.

Note that a reference voltage generator 50 for a reference cell according to this embodiment is also applicable to the read-system circuits of the MRAM shown in FIG. 3 without any contradiction.

[3-2] Effects

In the third embodiment described above, the third stage circuit for generating the potential VBIAS/2 from VBIAS is added to the reference voltage generator 50 for a reference cell. In the third circuit stage, the MTJ elements 81 and 82 set in the same resistance state are connected in series, and the potential VBIAS/2 at the middle point n13 of this connection is applied to the second circuit stage. Therefore, a desired bias potential VBIASREF can be generated by applying VBIAS/2 to the MTJ element 71 in the low-resistance state in the second circuit stage.

As describe above, in the circuit configuration shown in FIG. 6, only the same voltage as the bit line bias voltage VBIAS of a read object cell is applied to the MTJ element 61 set in the high-resistance state. Accordingly, the same effects as those of the first embodiment can be obtained.

Also, in the circuit configuration shown in FIG. 7, the potential VBIAS/2 is connected to the inverting input terminal (−) of the operational amplifier OP4 having a high input impedance. This makes it possible to implement the same configuration as that of the second embodiment, and obtain the same effects as those of the second embodiment.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic random access memory comprising:
   a memory cell having a first magnetoresistive effect element which changes to a high-resistance state and a low-resistance state;
   a reference cell having a second magnetoresistive effect element set in the low-resistance state;
   a first bit line connected to the memory cell, and set at a first bias potential in a read operation;
   a second bit line connected to the reference cell, and set at a second bias potential different from the first bias potential in the read operation; and
   a reference voltage generator including a reference current generator having a third magnetoresistive effect element set in the high-resistance state, and a current-voltage converter having a fourth magnetoresistive effect element set in the low-resistance state, the reference current generator generating a first electric current by applying the first bias potential to the third magnetoresistive effect element, and the current-voltage converter generating the second bias potential by supplying a second electric current different from the first electric current to the fourth magnetoresistive effect element.

2. The memory according to claim 1, wherein the reference current generator and the current-voltage converter are connected by a current mirror connection.

3. The memory according to claim 2, wherein a mirror ratio of the current mirror connection between the reference current generator and the current-voltage converter is 2:1.

4. The memory according to claim 3, wherein
   the reference current generator has a first transistor having a current path having one end connected to one terminal of the third magnetoresistive effect element,
   the current-voltage converter has a second transistor having a current path having one end connected to one terminal of the fourth magnetoresistive effect element,
   gates of the first transistor and the second transistor are connected to each other, and
   a ratio of a gate width of the first transistor to that of the second transistor is 2:1.

5. The memory according to claim 3, wherein a current value of the second electric current is ½ that of the first electric current.

6. The memory according to claim 1, wherein only a potential corresponding to the first bias potential is applied to the third magnetoresistive effect element.

7. The memory according to claim 1, wherein letting VBIAS be the first bias potential, Rmax be a resistance of the third magnetoresistive effect element, and Rmin be a resistance of the fourth magnetoresistive effect element, the second bias potential is given by (VBIAS/2)×(1+Rmin/Rmax).

8. The memory according to claim 1, wherein the second bias potential is lower than the first bias potential.

9. The memory according to claim 1, wherein
   the reference current generator includes a first transistor having a current path having one end connected to one terminal of the third magnetoresistive effect element, and a first operational amplifier,
   the current-voltage converter includes a second transistor having a current path having one end connected to one terminal of the fourth magnetoresistive effect element,
   gates of the first transistor and the second transistor are connected to each other,
   a connection point between one end of the current path of the first transistor and one terminal of the third magnetoresistive effect element is connected to an inverting input terminal of the first operational amplifier,
   an output terminal of the first operational amplifier is connected to a connection point between the gates of the first transistor and the second transistor,
   the first bias potential is applied to a positive input terminal of the first operational amplifier, and
   the second bias potential is generated from a connection point between one end of the current path of the second transistor and one terminal of the fourth magnetoresistive effect element.

10. The memory according to claim 9, wherein a potential ½ the first bias potential is applied to the other terminal of the fourth magnetoresistive effect element.

11. The memory according to claim 9, wherein
    the current-voltage converter further includes a third transistor and a second operational amplifier,
    one end of a current path of the third transistor is connected to the other terminal of the fourth magnetoresistive effect element, a connection point between one end of the current path of the third transistor and the other terminal of the fourth magnetoresistive effect element is connected to a positive input terminal of the second operational amplifier, an output terminal of the second operational amplifier is connected to a gate of the third transistor, and a potential ½ the first bias potential is applied to an inverting input terminal of the second operational amplifier.

12. The memory according to claim 1, wherein the reference voltage generator further includes a voltage generator which generates a potential ½ the first bias potential on the basis of the first bias potential.

13. The memory according to claim 12, wherein the reference current generator includes a first transistor having a current path having one end connected to one terminal of the third magnetoresistive effect element, and a first operational amplifier, the current-voltage converter includes a second transistor having a current path having one end connected to one terminal of the fourth magnetoresistive effect element, the voltage generator includes an even number of fifth magnetoresistive effect elements, a third transistor, and a second operational amplifier, gates of the first transistor and the second transistor are connected to each other, a connection point between one end of the current path of the first transistor and one terminal of the third magnetoresistive effect element is connected to an inverting input terminal of the first operational amplifier, an output terminal of the first operational amplifier is connected to a connection point between the gates of the first transistor and the second transistor, all the even number of fifth magnetoresistive effect elements are set in one of the low-resistance state and the high-resistance state, the even number of fifth magnetoresistive effect elements are connected in series to form an element group, one terminal of the element group is connected to one end of a current path of the third transistor, a connection point between the element group and one end of the current path of the third transistor is connected to an inverting input terminal of the second operational amplifier, an output terminal of the second operational amplifier is connected to a gate of the third transistor, the first bias potential is applied to positive input terminals of the first operational amplifier and the second operational amplifier, the potential ½ the first bias potential is generated from a middle point as a connection point in the element group, and applied to the other terminal of the fourth magnetoresistive effect element, and the second bias potential is generated from a connection point between one end of the current path of the second transistor and one terminal of the fourth magnetoresistive effect element.

14. The memory according to claim 13, wherein the current-voltage converter further includes a fourth transistor and a third operational amplifier, one end of a current path of the fourth transistor is connected to the other terminal of the fourth magnetoresistive effect element, a connection point between one end of the current path of the fourth transistor and the other terminal of the fourth magnetoresistive effect element is connected to a positive input terminal of the third operational amplifier, an output terminal of the third operational amplifier is connected to a gate of the fourth transistor, and the potential ½ the first bias potential is applied to an inverting input terminal of the third operational amplifier.

15. The memory according to claim 1, wherein each of the first magnetoresistive effect element, the second magnetoresistive effect element, the third magnetoresistive effect element, and the fourth magnetoresistive effect element includes a fixed layer, a recording layer, and a nonmagnetic layer sandwiched between the fixed layer and the recording layer, and the nonmagnetic layer is made of MgO.

16. The memory according to claim 1, wherein each of the first magnetoresistive effect element, the second magnetoresistive effect element, the third magnetoresistive effect element, and the fourth magnetoresistive effect element includes a fixed layer, a recording layer, and a nonmagnetic layer sandwiched between the fixed layer and the recording layer, and magnetization directions in the fixed layer and the recording layer are perpendicular to film surfaces.

17. The memory according to claim 1, wherein the memory cell further includes a first transistor having a current path having one end connected to the first magnetoresistive effect element, and the reference cell further includes a second transistor having a current path having one end connected to the second magnetoresistive effect element.

18. The memory according to claim 1, wherein letting VBIAS be the first bias potential, Rmax be a resistance of the third magnetoresistive effect element, and Rmin be a resistance of the second magnetoresistive effect element and the fourth magnetoresistive effect element, an electric current flowing through the reference cell is given by (VBIAS/2)×(1/Rmin+1/Rmax).

19. The memory according to claim 1, wherein the reference cell uses only the second magnetoresistive effect element set in the low-resistance state.

20. The memory according to claim 1, wherein the magnetic random access memory is a spin transfer torque magnetization reversal type memory.

* * * * *